US010733934B2

(12) United States Patent
Lee et al.

(10) Patent No.: US 10,733,934 B2
(45) **Date of Patent: *Aug. 4, 2020**

(54) ORGANIC LIGHT-EMITTING DISPLAY DEVICE AND DRIVING METHOD FOR IMPLEMENTING NORMAL AND STANDBY MODES THROUGH DRIVING TRANSISTOR VOLTAGE CONTROL

(71) Applicant: LG DISPLAY CO., LTD., Seoul (KR)

(72) Inventors: BuYeol Lee, Goyang-si (KR); YoungJoon Lee, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/566,526

(22) Filed: Sep. 10, 2019

(65) Prior Publication Data

US 2020/0005712 A1 Jan. 2, 2020

Related U.S. Application Data

(63) Continuation of application No. 15/793,541, filed on Oct. 25, 2017, now Pat. No. 10,453,393.

(30) Foreign Application Priority Data

Dec. 20, 2016 (KR) ........................ 10-2016-0175038

(51) Int. Cl.
*G09G 3/3233* (2016.01)
*H01L 51/52* (2006.01)
*G09G 3/3258* (2016.01)

(52) U.S. Cl.
CPC ......... *G09G 3/3233* (2013.01); *G09G 3/3258* (2013.01); *G09G 2300/0852* (2013.01);
(Continued)

(58) Field of Classification Search
CPC ...... G09G 3/32; G09G 3/3208; G09G 3/3225; G09G 3/3233; G09G 3/3241; G09G 3/325;
(Continued)

(56) References Cited

U.S. PATENT DOCUMENTS

| | | | |
|---|---|---|---|
| 10,139,958 | B2 | 11/2018 | Ding et al. |
| 2004/0222951 | A1 | 11/2004 | Lee et al. |

(Continued)

FOREIGN PATENT DOCUMENTS

| | | | |
|---|---|---|---|
| CN | 101425259 | A | 5/2009 |
| CN | 102542983 | A | 7/2012 |
| CN | 106231218 | A | 12/2016 |

*Primary Examiner* — Darlene M Ritchie
(74) *Attorney, Agent, or Firm* — Birch, Stewart, Kolasch & Birch, LLP

(57) ABSTRACT

An organic light-emitting display device can include a display panel including a plurality of pixels and configured to express luminance based on a driving current corresponding to a data signal for providing a data voltage and a first power; a control circuit configured to output a first mode control signal corresponding to a normal mode and a second mode control signal corresponding to a standby mode for providing lower luminance than the normal mode; and a power source configured to supply the first power to the display panel at a first voltage level, in response to receiving the first mode control signal corresponding to the normal mode, and supply the first power to the display panel at a second voltage level that is lower than the first voltage level, in response to receiving the second mode control signal corresponding to the standby mode.

8 Claims, 11 Drawing Sheets

(52) U.S. Cl.
CPC ............... *G09G 2300/0866* (2013.01); *G09G 2310/0251* (2013.01); *G09G 2310/0262* (2013.01); *G09G 2320/043* (2013.01); *G09G 2320/0626* (2013.01); *G09G 2330/021* (2013.01); *H01L 51/5206* (2013.01); *H01L 51/5221* (2013.01)

(58) Field of Classification Search
CPC ......... G09G 3/3258; G09G 2310/0251; G09G 2310/0262; G09G 2330/021; G09G 2300/0852; G09G 2300/0866; G09G 2320/043; G06F 1/3265; G06F 1/3262; H01L 51/5206; H01L 51/5221
See application file for complete search history.

(56) References Cited

U.S. PATENT DOCUMENTS

| | | | | |
|---|---|---|---|---|
| 2004/0246241 | A1 | 12/2004 | Sato et al. | |
| 2008/0074412 | A1 | 3/2008 | Nozawa | |
| 2008/0218455 | A1 | 9/2008 | Yamamoto et al. | |
| 2009/0109147 | A1 | 4/2009 | Park et al. | |
| 2011/0084953 | A1 | 4/2011 | Lee et al. | |
| 2011/0084958 | A1 | 4/2011 | Choi et al. | |
| 2012/0098805 | A1 | 4/2012 | Kubota et al. | |
| 2012/0161637 | A1 | 6/2012 | Lee et al. | |
| 2013/0293600 | A1* | 11/2013 | Lee ...................... | G09G 3/3258 345/691 |
| 2013/0321382 | A1* | 12/2013 | Nagao ................... | G06F 3/0412 345/212 |
| 2014/0035799 | A1 | 2/2014 | Bae et al. | |
| 2014/0139510 | A1 | 5/2014 | Han et al. | |
| 2014/0145917 | A1 | 5/2014 | Kwak | |
| 2014/0176456 | A1 | 6/2014 | Yoon | |
| 2016/0125809 | A1 | 5/2016 | Hwang | |
| 2016/0179179 | A1 | 6/2016 | An et al. | |
| 2016/0329014 | A1 | 11/2016 | Lee | |
| 2017/0069263 | A1 | 3/2017 | Hu | |
| 2017/0301281 | A1* | 10/2017 | Paanajarvi ............... | G09G 3/20 |
| 2018/0233086 | A1 | 8/2018 | He et al. | |

* cited by examiner

ORGANIC LIGHT-EMITTING DISPLAY DEVICE AND DRIVING METHOD FOR IMPLEMENTING NORMAL AND STANDBY MODES THROUGH DRIVING TRANSISTOR VOLTAGE CONTROL

CROSS-REFERENCE TO RELATED APPLICATION

This application is a Continuation of U.S. patent application Ser. No. 15/793,541, filed on Oct. 25, 2017, which claims the benefit of priority from Korean Patent Application No. 10-2016-0175038 filed in the Republic of Korea on Dec. 20, 2016, all of these applications are hereby incorporated by reference for all purposes as if fully set forth herein.

BACKGROUND

Field of the Invention

Exemplary embodiments of the present disclosure relate to an organic light-emitting display device and a driving method for the same.

Description of Related Art

In response to the development of the information society, there has been increasing demand for various types of display devices able to display images. Recently, a range of display devices, such as liquid crystal display (LCD) devices, plasma display panels (PDPs), and organic light-emitting display devices, are in use.

Among the range of display devices, organic light-emitting display devices have superior characteristics, such as high color reproduction accuracy, wide viewing angles, and rapid response rates, since organic light-emitting diodes (OLEDs) able to emit light by themselves are used therein. In addition, organic light-emitting display devices are widely used in mobile devices, such as smartphones and tablet PCs, since organic light-emitting display devices are thin and light, and consume less power.

The operating times of mobile devices may be determined by the capacities of batteries, since mobile devices are supplied with power from batteries. However, since mobile devices are designed to have thin profiles to improve ease of use, battery capacities are limited and thus the operating times of mobile devices are reduced. In particular, since mobile devices, such as smartphones and tablet PCs, include a variety of sensors, a touch panel, and the like to perform a variety of functions, there is a need to increase operating times by reducing power consumption.

BRIEF SUMMARY

Various aspects of the present disclosure provide an organic light-emitting display device and a driving method for the same, in which power consumption can be reduced.

Also provided are an organic light-emitting display device and a driving method for the same, in which luminance can be adjusted without adjustment in data voltages.

According to an aspect of the present disclosure, an organic light-emitting display device can include: a display panel having first power and second power supplied thereto, in which the display panel provides luminance based on driving current corresponding to a data signal and operates in a normal mode and a standby mode in response to a voltage level of the first power, a luminance of the standby mode is lower than a luminance of the normal mode; a control circuit outputting mode control signals corresponding to the normal mode and the standby mode; and a power source supplying the first power and the second power to the display panel. In response to the mode control signals, the power source supplies a first voltage as a voltage of the first power in the normal mode and supplies a second voltage as a voltage of the first power in the standby mode. The voltage level of the second voltage is lower than the voltage level of the first voltage. The voltage level of the second voltage is set such that a difference between the amount of driving current corresponding to the first voltage and a data voltage and the amount of driving current corresponding to the second voltage and the data voltage is greater than a predetermined value.

According to another aspect of the present disclosure, an organic light-emitting display device can include: a display panel operating such that an amount of driving current in a normal mode is greater than an amount of driving current in a standby mode; a control circuit outputting mode control signals; and a power supply applying a first voltage to the display panel in the normal mode and a second voltage to the display panel in the standby mode in response to the mode control signals. A change in the amount of driving current flowing through a pixel when a change in the voltage level of the second voltage is a predetermined voltage is greater than a change in the amount of driving current flowing through the pixel when a change in the voltage level of the first voltage is the predetermined voltage.

According to another aspect of the present disclosure, provided is a method of driving an organic light-emitting display device including a number of pixels. The method can include: receiving mode control signals for instructing a normal mode and a standby mode; supplying a first voltage to first power in the normal mode and supplying a second voltage to second power in the standby mode, the second voltage is lower than the first voltage; and supplying driving current corresponding to the first voltage to an organic light-emitting diode (OLED) in the normal mode and supplying driving current corresponding to the second voltage to the OLED in the standby mode. The second voltage is set such that a difference between an amount of driving current corresponding to the first voltage and a data voltage and an amount of driving current corresponding to the second voltage and the data voltage is greater than a predetermined value.

According to still another aspect of the present disclosure, provided is a method of driving an organic light-emitting display device including a number of pixels. The method can include: receiving mode control signals for instructing a normal mode and a standby mode; supplying a first voltage to first power in the normal mode and supplying a second voltage to second power in the standby mode, the second voltage is lower than the first voltage; and supplying driving current corresponding to the first voltage to an OLED in the normal mode and supplying driving current corresponding to the second voltage to the OLED in the standby mode. A change in the amount of driving current flowing through a pixel when a change in the voltage level of the second voltage is a predetermined voltage is greater than a change in the amount of driving current flowing through the pixel when a change in the voltage level of the first voltage is the predetermined voltage.

According to the present disclosure as set forth above, the organic light-emitting display device and the driving method for the same can reduce power consumption.

In addition, according to the present disclosure, the organic light-emitting display device and the driving method for the same can adjust luminance without adjusting data voltages.

BRIEF DESCRIPTION OF THE DRAWINGS

The above and other objects, features and advantages of the present disclosure will be more clearly understood from the following detailed description when taken in conjunction with the accompanying drawings, in which.

DETAILED DESCRIPTION

Figure 1:
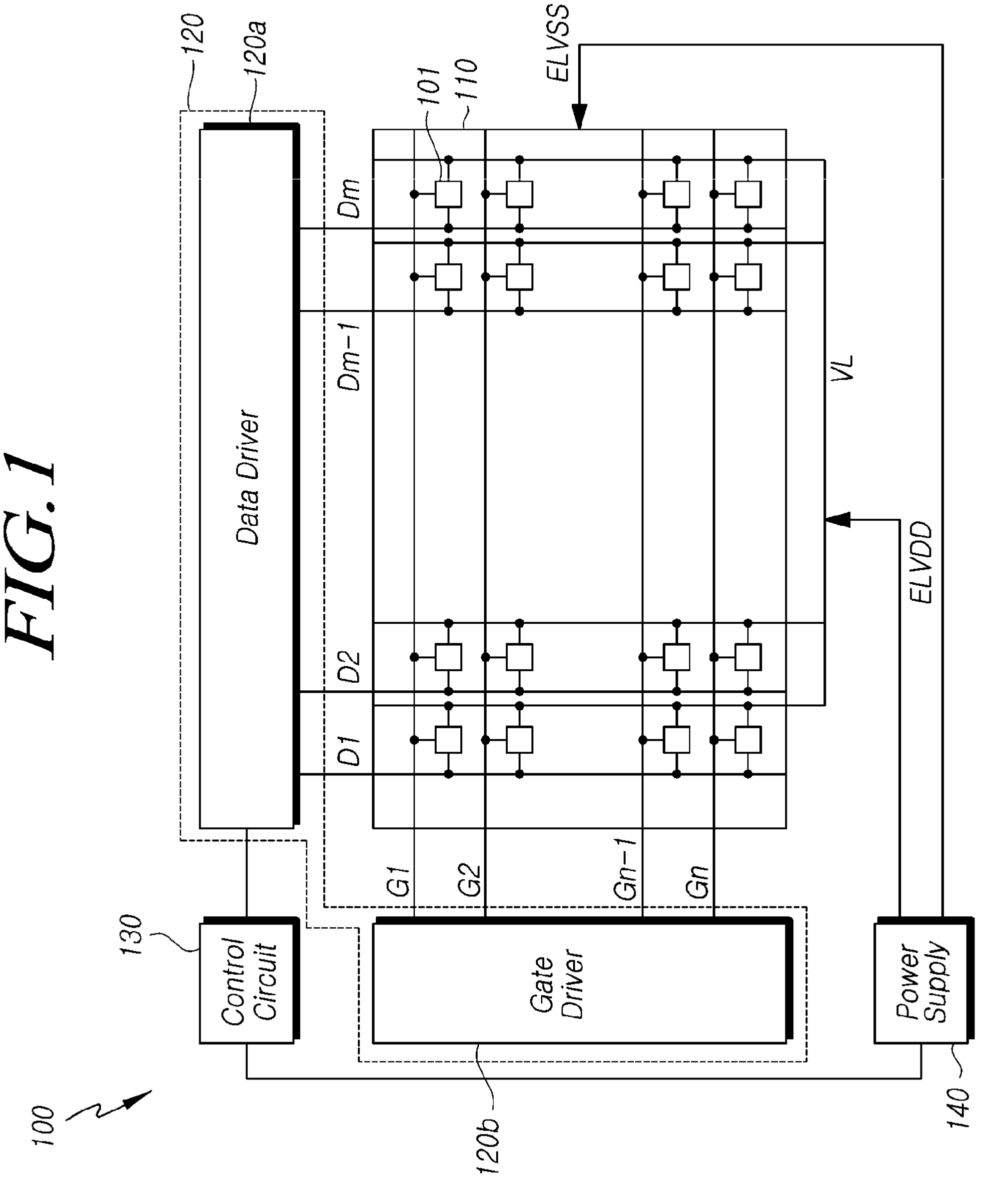
FIG. 1 is a configuration view illustrating an organic light-emitting display device according exemplary embodiments.

Hereinafter, reference will be made to embodiments of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated herein will be omitted in the situation that the subject matter of the present disclosure may be rendered unclear thereby.

It will also be understood that, while terms such as “first,” “second,” “A,” “B,” “(a),” and “(b)” can be used herein to describe various elements, such terms are only used to distinguish one element from another element. The substance, sequence, order, or number of these elements is not limited by these terms. When an element is referred to as being “connected to” or “coupled to” another element, not only can it be “directly connected or coupled to” the other element, but it can also be “indirectly connected or coupled to” the other element via an “intervening” element. In the same context, when an element is referred to as being formed “on” or “under” another element, not only can it be directly formed on or under another element, but it can also be indirectly formed on or under another element via an intervening element.

FIG. 1 is a configuration view illustrating an organic light-emitting display device 100 according exemplary embodiments.

Referring to FIG. 1, the organic light-emitting display device 100 includes a display panel 110 to which first power ELVDD and second power ELVSS are supplied, a control circuit 130, and a power supply 140. The display panel 110 provides luminance, based on driving current corresponding to data signals, and operates in a normal mode as well as in a standby mode, the standby mode operating at lower luminance than the normal mode. The control circuit 130 outputs mode control signals corresponding to the normal mode and the standby mode. The power supply 140 supplies the first power ELVDD and the second power ELVSS to the display panel 110.

In addition, the organic light-emitting display device 100 includes a driver integrated circuit (IC) 120 supplying data signals to the display panel 110. The driver IC 120 supplies gate signals to the organic light-emitting display device 100 so that data signals are sequentially provided to the display panel. The driver IC 120 includes a gate driver 120*b* driving gate signals and a data driver 120*a* receiving digital image signals, converting the digital image signals into analog data signals, and providing the analog data signals to data lines.

The display panel 110 includes a number of gate lines G1, G2, . . . , Gn-1, and Gn receiving gate signals from the gate driver 120*b* and a number of data lines D1, D2, . . . , Dm-1, and Dm receiving data signals from the data driver 120*a*. The number of gate lines G1, G2, . . . , Gn-1, and Gn intersect the number of data lines D1, D2, . . . , Dm-1, and Dm. A number of pixels 101 are arranged in areas in which the number of gate lines G1, G2, . . . , Gn-1, and Gn intersect the number of data lines D1, D2, . . . , Dm-1, and Dm. In addition, the display panel 110 has first power lines VL, through which delivering voltages of the first power are delivered to the number of pixels 101, such that the number of pixels 101 receive the voltages of the first power from the first power lines VL. Furthermore, a common electrode is disposed in the display panel 110, such that the number of pixels 101 receive voltages of the second power from the common electrode.

The control circuit 130 provides control signals to the driver IC 120. The control signals provided to the driver IC 120 can include a gate start pulse, a data start pulse, a horizontal synchronization signal, a vertical synchronization signal, and a clock signal. In addition, the control circuit 130 provides mode control signals to the power supply 140. In response to the mode control signals, the display panel 110 is controlled to operate in a normal mode or in a standby mode. In addition, the control circuit 130 provides digital images to the driver IC 120.

The power supply 140 supplies the first power ELVDD and the second power ELVSS, generated thereby, to the display panel 110. The first power ELVDD is supplied to the first power lines VL of the display panel 110, and the second power ELVSS is supplied to the common electrode of the display panel 110. However, the present disclosure is not limited thereto.

The power supply 140 regulates voltages of the first power based on mode control signals received from the control circuit 130. When the display panel 110 operates in the normal mode in response to a mode control signal, the voltage of the first power ELVDD is supplied at a first voltage level. Further, when the display panel 110 operates in the standby mode in response to a mode control signal, the voltage of the first power ELVDD is set to a second voltage level lower than the first voltage level.

Although the gate driver 120*b* included in the driver IC is illustrated as being a component separate from the display panel 110, the present disclosure is not limited thereto. The gate driver 120*b* can be disposed in a non-display area of the display panel 110. The gate driver 120*b* disposed in the non-display area of the display panel 110 can be referred to as a gate in panel (GIP). In addition, although the gate driver 120*b* is illustrated as being disposed on one side of the display panel 110, the present disclosure is not limited thereto. The gate driver 120*b* can be disposed on both sides of the display panel 110.

Figure 2:
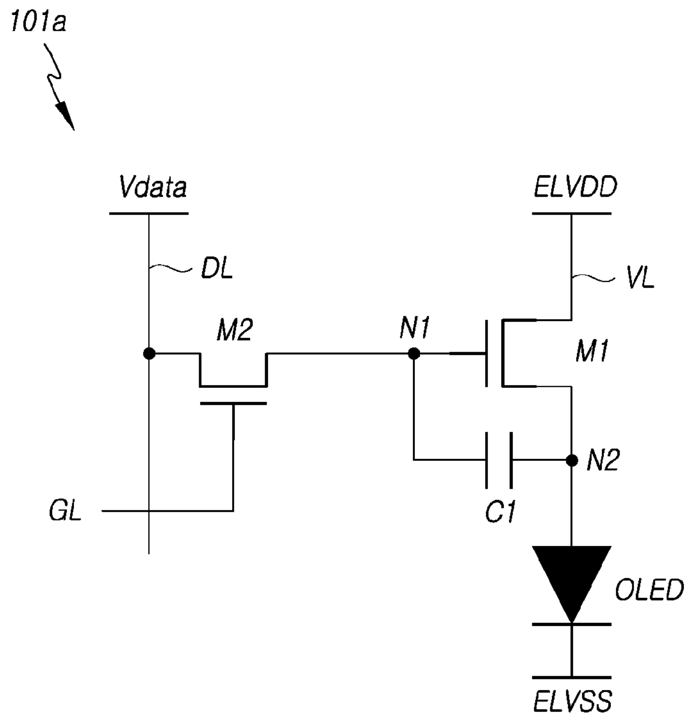
FIG. 2 is a circuit diagram illustrating a first embodiment of the pixel provided in the organic light-emitting display device illustrated in FIG. 1.

FIG. 2 is a circuit diagram illustrating a first embodiment of the pixel provided in the organic light-emitting display device illustrated in FIG. 1.

Referring to FIG. 2, the pixel 101 includes a pixel circuit 101*a* generating a driving current and an organic light-emitting diode (OLED) generating light in response to the driving current generated by the pixel circuit 101*a*. The pixel circuit 101*a* receives a data voltage Vdata, a gate signal, a voltage of first power ELVDD, a voltage of second power ELVSS. The pixel circuit 101*a* includes first and second transistors M1 and M2 and a first capacitor C1. The first and second transistors M1 and M2 can be N-type metal-oxide-semiconductor (N-MOS) transistors. However, the present disclosure is not limited thereto.

The first transistor M1 has a first electrode connected to a first power line VL, through which the first power ELVDD is delivered, a gate electrode connected to a first node N1, and a second electrode connected to a second node N2. The first transistor M1 allows the driving current to flow from the first electrode to the second electrode, in response to a voltage of the first node N1. The first transistor M1 can be referred to as a driving transistor.

The second transistor M2 has a first electrode connected to a data line DL, through which the data voltage Vdata is delivered, a gate electrode connected to a gate line, through which a gate signal is delivered, and a second electrode connected to the first node N1. The second transistor M2 delivers the data voltage Vdata to the first node N1 in response to the gate signal provided to the gate electrode. The second transistor M2 can be referred to as a switching transistor.

The first capacitor C1 is connected to both the first node N1 and the second node N2 to allow the voltage of the first node N1 to be maintained.

The OLED has an anode connected to the second node N2 and a cathode connected to the second power ELVSS to generate light by receiving the driving current flowing through the second node N2.

In the pixel circuit 101*a*, the first transistor M1 has the first electrode connected to the first power ELVDD, the gate node connected to the first node N1, and the second electrode connected to the second node N2, the second transistor M2 has the first electrode connected to the data line DL, the gate electrode connected to the gate line, and the second electrode connected to the first node N1, and the capacitor C1 has the first electrode connected to the first node N1 and the second electrode connected to the second node N2.

In the pixel circuit 101*a* configured as above, the magnitude of a driving current flowing through the OLED can correspond to Formula 1.

$$I_{OLED} = \frac{\beta}{2}(V_{GS} - V_{th})^2, \tag{1}$$

where IOLED indicates the magnitude of the driving current, β is a constant, VGS indicates the difference in voltage between the second electrode and the gate electrode the first transistor M1, and Vth indicates the threshold voltage of the first transistor M1.

Figure 3:
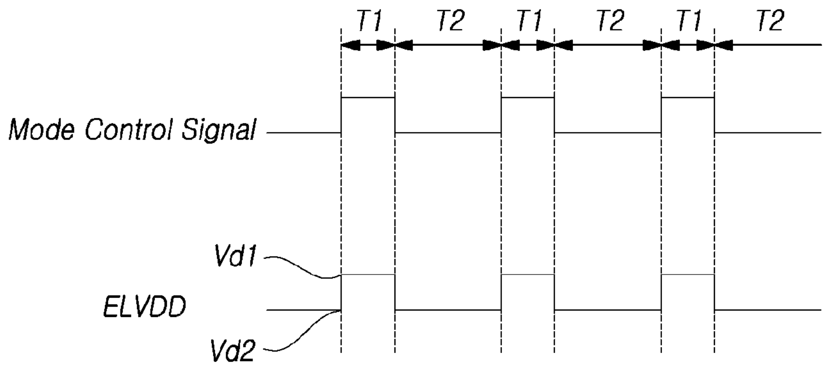
FIG. 3 is a waveform diagram illustrating a display mode in response to a mode control signal in the organic light-emitting display device illustrated in FIG. 1.

FIG. 3 is a waveform diagram illustrating display modes according to a mode control signal in the organic light-emitting display device illustrated in FIG. 1.

Referring to FIG. 3, the display panel 110 operates in a normal mode in normal mode sections T1, while operating in a standby mode in standby mode sections T2. In the normal mode sections T1, the display panel 110 expresses normal images at a luminance level set by a user. In the standby mode sections T2, images are displayed at a luminance level lower than the luminance level set by the user, in order to reduce power consumption. In addition, the normal mode can be enabled when the user uses the organic light-emitting display device, while the standby mode can be enabled when the user has not used the organic light-emitting display device for a predetermined period of time. However, the present disclosure is not limited thereto.

When the display panel 110 operates in the normal mode, the control circuit 130 outputs a mode control signal in a high state. In addition, when the display panel 110 operates in the standby mode, the control circuit 130 outputs a mode control signal in a low state. When a mode control signal is output in a high state, the power supply 140 outputs first power ELVDD, the voltage level of which is a first voltage Vd1, in response to the mode control signal. When a mode control signal is output in a low state, the power supply 140 outputs first power ELVDD, the voltage level of which is a second voltage Vd2, in response to the mode control signal. The voltage level of the second voltage can be lower than the voltage level of the first voltage Vd1.

Figure 4:
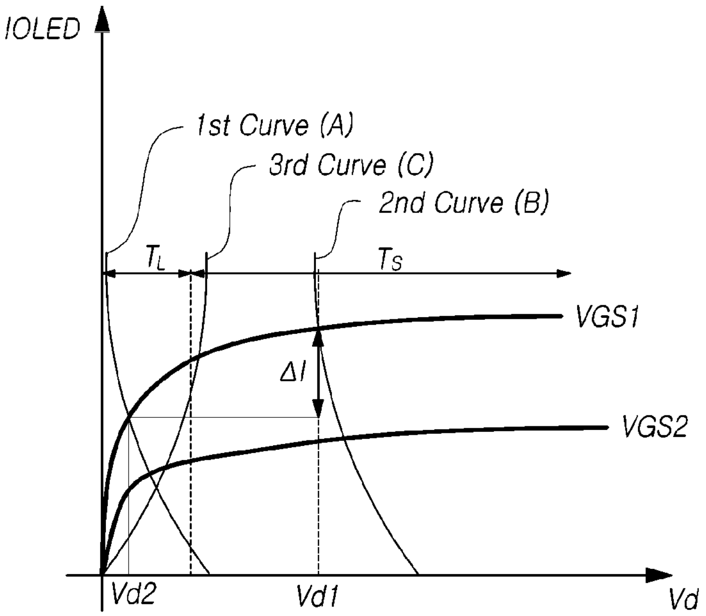
FIG. 4 is a graph illustrating the characteristics of driving current applied to an OLED by a driving transistor.

FIG. 4 is a graph illustrating the characteristics of driving current applied to an OLED by a driving transistor.

Referring to FIG. 4, a first voltage Vd1 is supplied in a first section TS, in which the voltage of first power ELVDD is higher than the threshold voltage of the driving transistor, while a second voltage Vd2 is supplied in a second section TL, in which the voltage of the first power ELVDD is lower than the threshold voltage of the driving transistor. The first section TS is a voltage section of the first power ELVDD when the display panel 110 operates in a normal mode, while the second section TL is a voltage section of the first power ELVDD when the display panel 110 operates in a standby mode.

In the situation, in which the voltage of the first power ELVDD increases and there is a significant difference between a voltage applied to a second electrode and the voltage of a gate electrode of the driving transistor, a driving current IOLED is indicated by curve VGS1. When the difference between the voltage applied to the second electrode and the voltage of the gate electrode of the driving transistor is insignificant, the driving current IOLED is indicated by curve VGS2.

Thus, it is possible to adjust the magnitude of the driving current IOLED by adjusting the difference in voltage between the second electrode and the gate electrode of the driving transistor based on a data voltage applied to the gate electrode, so that a gray scale can be provided for light generated by the OLED.

When the voltage of the first power ELVDD is the first voltage Vd1 located in the first section TS (normal mode), the difference in voltage between the second electrode and the gate electrode of the driving transistor is constant, and even in the situation in which the first voltage Vd1 changes in the normal mode section TS, a change in the driving current is insignificant (e.g., there is negligible increase in the driving current). Accordingly, there is no change in luminance and thus, gray scales corresponding to data voltages can be provided. It is therefore possible to vary the magnitude of the driving current IOLED flowing through the OLED, in response to the data voltages, by setting the voltage of the first power ELVDD to be the first voltage Vd1 in the normal mode.

In contrast, when the voltage of the first power ELVDD is the second voltage Vd2 located in a second section TL (standby mode), the driving current IOLED has a significant change ΔI in the second section TL in response to a change in the second voltage Vd2, even in the situation in which the difference in voltage between the second electrode and the gate electrode of the driving transistor is constant. Thus, even in the situation in which the data voltage is relatively constant, the driving current can significantly change, and a constant gray scale cannot be expressed when the second voltage Vd2 changes slightly. Accordingly, this operation region of the driving transistor cannot be used in the normal mode.

In addition, the first section TS can be referred to as a saturation section since a small amount of the driving current IOLED changes therein, while the second section TL may be referred to as a linear section, since a large amount of the driving current IOLED changes therein.

In addition, the luminance of the OLED can be provided by the first curve A in the first section TS, corresponding to changes in the voltage applied to the gate electrode of the driving transistor, while being provided by the second curve B, corresponding to changes in the voltage of the gate electrode. Comparing the first curve A and the second curve B, it can be appreciated that the amount of driving current flowing through the second section TL is significantly smaller than the amount of driving current flowing through the first section TS, even in the situation in which the difference in voltage between the second electrode and the gate electrode of the driving transistor is the same in both the first and second sections.

It is therefore possible to significantly reduce power consumption by allowing the driving transistor to drive in the second section TL. Although a difference in luminance is likely to be significant in the second section TL, a low luminance level can cause the difference in luminance to be insignificant. Thus, when the display panel 110 illustrated in FIG. 1 operates in the standby mode, the control circuit 130 can set the voltage of the first power ELVDD to be the second voltage Vd2 located in the second section TL by controlling the power supply 140. It is thereby possible to reduce power consumption in the standby mode by controlling the organic light-emitting display device to operate using the second voltage Vd2, in which the voltage level of the first power ELVDD is lower than the threshold voltage.

In addition, the threshold voltage of the driving transistor can be indicated by a third curve C, corresponding to the difference in voltage between the second electrode and the gate electrode of the driving transistor and the voltage difference of the first power ELVDD. The threshold voltage can be determined by a voltage of the first power ELVDD applied to the first electrode of the driving transistor, a voltage applied to the gate electrode of the driving transistor, and a voltage applied to the second electrode of the driving transistor.

Thus, the threshold voltage of the driving transistor can be expressed by Formula 2.

$$V_{th}=V_{GS}-V_{DS} \quad (2),$$

where Vth indicates the threshold voltage of the driving transistor, VGS indicates the difference in voltage between the gate electrode and the second electrode of the driving transistor, and VDS indicates the difference in voltage between the first electrode and the second electrode of the driving transistor.

That is, the threshold voltage may be a result obtained by deducting the difference in voltage between the first electrode and the second electrode of the driving transistor from the difference in voltage between the gate electrode and the second electrode of the driving transistor. Accordingly, it is possible to determine whether the driving transistor operates in the first section TS or the second section TL, by comparing the voltage level of the threshold voltage and the voltage level of the first power.

In addition, this can be applied to the pixels illustrated in FIG. 2. When the difference in voltage between the first power ELVDD and the second power ELVSS is greater than a data voltage, the driving transistor operates in the first section TS. In contrast, when the difference in voltage between the first power ELVDD and the second power ELVSS is lower than the data voltage, the driving transistor operates in the second section TL.

In addition, when the voltage of the first power ELVDD is the second voltage Vd2, the voltage level of which is smaller than the voltage level of the threshold voltage, there is a significant difference in the amount of driving current. Thus, the voltage level of the first power ELVDD can be determined to be the voltage level of the first voltage Vd1 or the second voltage Vd2, based on the amount of the driving current corresponding to the data voltage Vdata. Specifically, when an amount of the driving current IOLED is not determined to be different from a predetermined value, based on the data voltage Vdata, the voltage level of the first power ELVDD can be determined to be the first voltage Vd1. When the amount of the driving current is different from the predetermined value, based on the data voltage Vdata, the voltage level of the first power ELVDD can be determined to be the second voltage Vd2. That is, when the magnitude of the driving current is equal to or lower than the magnitude of the driving current flowing in the normal mode based on the predetermined value, the voltage of the first power ELVDD is determined to be the second voltage Vd1. The voltage of the first power ELVDD can be determined to be the voltage of the first power ELVDD applied to the first electrode of the driving transistor in the standby mode. The power supply 140 illustrated in FIG. 1 can generate a voltage level set to the second voltage Vd2 in the standby mode and can supply the generated voltage as a voltage level of the first power in the standby mode.

Figure 5:
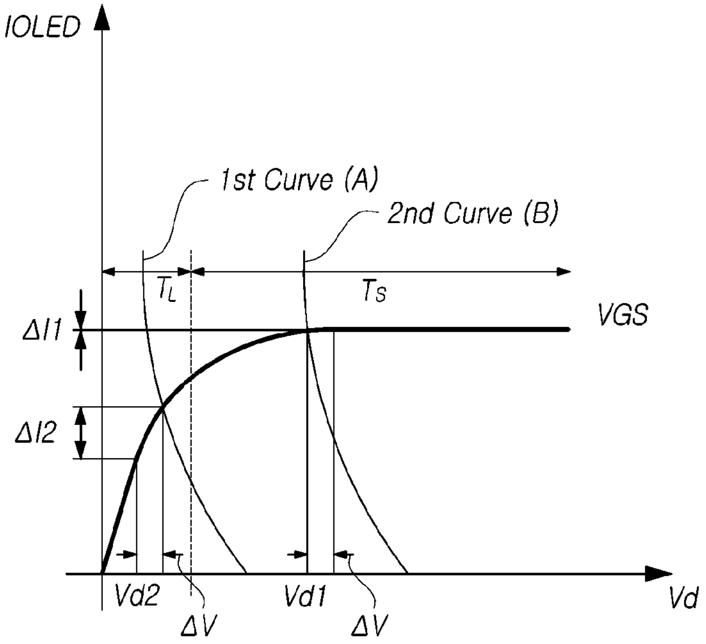
FIG. 5 is another graph illustrating the characteristics of driving current applied to an OLED by a transistor.

FIG. 5 is a graph illustrating the characteristics of driving current applied to an OLED by a transistor.

Referring to FIG. 5, when a predetermined voltage level ΔV is added to a voltage level of a first voltage Vd1 that is higher than the threshold voltage of a driving transistor, a corresponding change in driving current IOLED flowing through the driving transistor can be referred to as a first change ΔI1. When the predetermined voltage level ΔV is added to a voltage level of a second voltage Vd2 that is lower than the threshold voltage of the driving transistor, a corresponding change in the driving current IOLED flowing through the driving transistor can be referred to as a second change ΔI2. Accordingly, the second change ΔI2 is greater than the first change ΔI1. That is, in the situation in which the voltage level of the first power ELVDD is changed by a predetermined voltage, and a change in the driving current IOLED is, for example, the first change ΔI1 that is equal to or less than a predetermined value, it is determined that the first voltage Vd1 is supplied by the first power ELVDD. When the change in the driving current IOLED is, for example, the second change ΔI2 that is greater than the predetermined value, it is determined that the second voltage Vd2 is supplied by the first power ELVDD. In addition, the power supply 140 illustrated in FIG. 1 can generate and supply a voltage level set to the second voltage Vd2 for the first power ELVDD in the standby mode.

Figure 6:
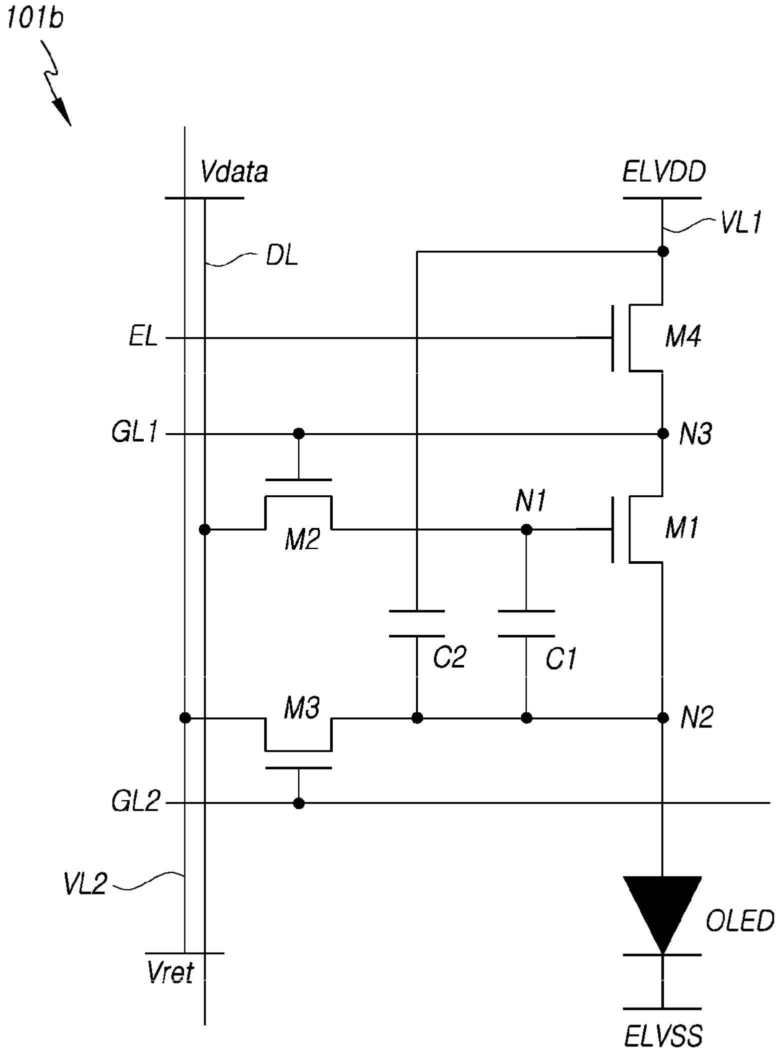
FIG. 6 is a circuit diagram illustrating a second embodiment of the pixel provided in the organic light-emitting display device illustrated in FIG. 1.

FIG. 6 is a circuit diagram illustrating a second embodiment of the pixel provided in the organic light-emitting display device illustrated in FIG. 1.

Referring to FIG. 6, the pixel 101 includes a pixel circuit 101*b* generating driving current and an OLED. The pixel circuit 101*b* receives a data voltage Vdata, a first gate signal, a second gate signal, an emission control signal, a voltage of first power ELVDD, a voltage of second power ELVSS, and an initialization voltage Vref, corresponding to data signals. In addition, the pixel circuit 101*b* includes first to fourth transistors M1 to M4, and first and second capacitors C1 and C2. The first transistor M1 can be a driving transistor. In addition, the first to fourth transistors M1 to M4 respectively include a first electrode, a second electrode, and a gate electrode. The first electrode can be a drain electrode, while the second electrode can be a source electrode. However, the first and second electrodes are not limited thereto. In addition, the first to fourth transistors M1 to M4 can be N-MOS transistors. However, the first to fourth transistors are not limited thereto.

In the first transistor M1, the first electrode is connected to a third node N3, the gate electrode is connected to a first node N1, and the second electrode is connected to a second node N2. The first transistor M1 allows driving current to flow from the first electrode to the second electrode in response to a voltage delivered to the gate electrode.

In the second transistor M2, the first electrode is connected to a data line DL, the gate electrode is connected to a first gate line GL1, and the second electrode is connected to the first node N1. In response to a first gate signal provided to the gate electrode, the second transistor M2 delivers the data voltage Vdata from the first electrode to the second electrode, thereby delivering the data voltage Vdata to the first node N1.

In the third transistor M3, the first electrode is connected to an initialization voltage line VL2, through which the initialization voltage is delivered, the gate electrode is connected to a second gate line GL2, and the second electrode is connected to the second node N2. The third transistor M3 delivers the initialization voltage Vref to the second node N2 in response to the second gate signal provided to the gate electrode. Here, the initialization voltage Vref can be a voltage lower than the threshold voltage of the OLED.

In the fourth transistor M4, the first electrode is connected to a power line VL1, through which the first power ELVDD is delivered, the gate electrode is connected to an emission control line EL, and the second electrode is connected to the third node N3. The fourth transistor M4 delivers a voltage of the first power ELVDD to the third node N3 in response to the emission control signal provided to the gate electrode.

The first capacitor C1 is connected to the first node N1 and the second node N2. The first capacitor C1 allows a difference in voltage between the gate electrode and the second electrode of the first transistor M1 to be maintained. In addition, the voltage stored in the first capacitor C1 can be initialized by the initialization voltage Vref delivered, in response to the third transistor M3 being turned on by the second gate signal.

The second capacitor C2 is connected to the power line VL1, through which the first power ELVDD is supplied, and the second node N2. The voltage stored in the second capacitor C2 can be initialized by the initialization voltage Vref delivered in response to the third transistor M3 being turned on by the second gate signal.

In addition, in the OLED, the anode is connected to the second electrode of the first transistor M1, and the cathode is connected to the second power ELVSS.

The first power ELVDD can deliver the first voltage Vd1 (FIG. 4 or 5) to the pixel circuit 101*b* in the normal mode and the second voltage Vd2 (FIG. 4 or 5) in the standby mode.

In the first transistor M1, the voltage of the first power ELVDD, the voltage applied to the gate electrode, and the voltage applied to the second electrode are determined. The voltage of the first power ELVDD can be determined to be the second voltage Vd2 when Formula 3 is satisfied.

$$ELVDD < V_{data} - V_{ref} - (V_{data} - V_{ref}) \times \frac{C1}{C1 + C2}, \quad (3)$$

where ELVDD indicates the voltage of the first power, Vdata indicates a data voltage corresponding to a data signal, Vref indicates the voltage of the initialization signal, C1 indicates the capacitance of the first capacitor, C2 indicates the capacitance of the second capacitor, VDS indicates the difference in voltage between the first electrode and the second electrode of the first transistor, and VGS indicates the difference in voltage between the gate electrode and the second electrode of the first transistor.

Figure 7:
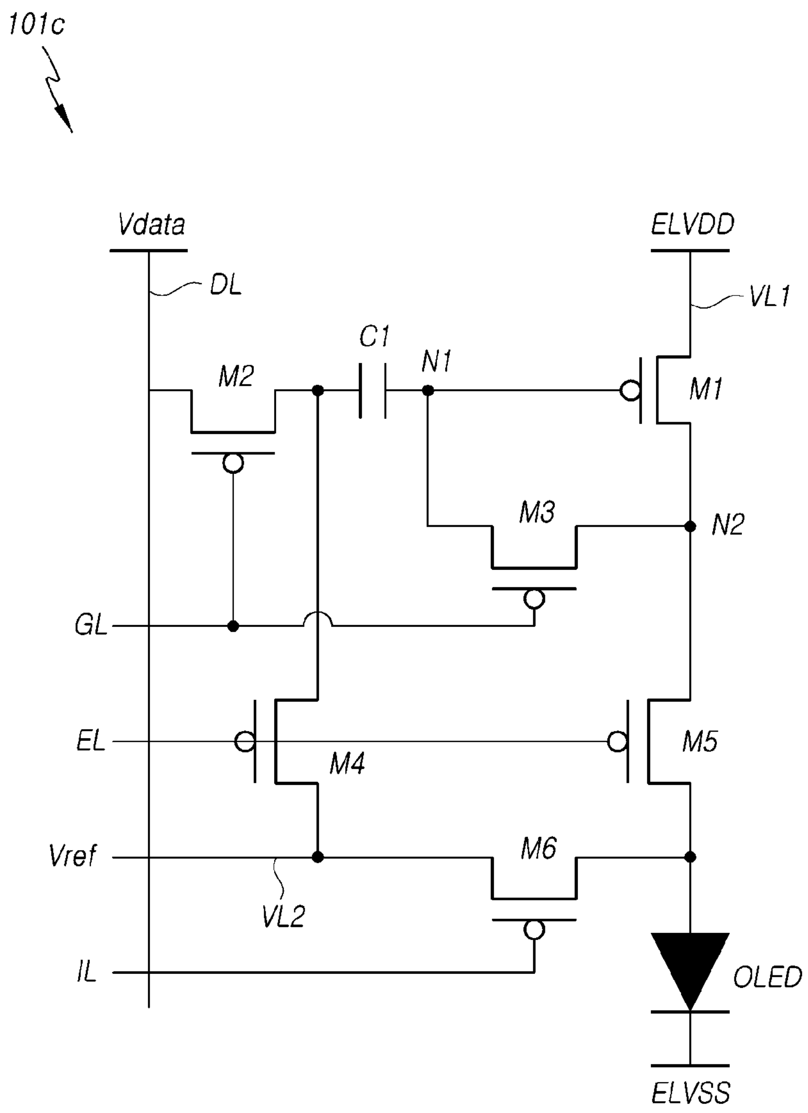
FIG. 7 is a circuit diagram illustrating a third embodiment of the pixel provided in the organic light-emitting display device illustrated in FIG. 1.

FIG. 7 is a circuit diagram illustrating a third embodiment of the pixel provided in the organic light-emitting display device illustrated in FIG. 1.

Referring to FIG. 7, the pixel 101 includes a pixel circuit 101*c* generating driving current and an OLED. The pixel circuit 101*c* receives a data voltage Vdata, a gate signal, an emission control signal, an initialization control signal, a voltage of first power ELVDD, a voltage of second power ELVSS, and an initialization voltage Vref. The pixel circuit 101*c* includes first to sixth transistors M1 to M6 and a first capacitor C1. Here, the first transistor M1 can be a driving transistor. The first to sixth transistors M1 to M6 respectively include a first electrode, a second electrode, and a gate electrode. The first electrode can be a drain electrode, while the second electrode can be a source electrode. However, the first and second electrodes are not limited thereto. In addition, the first to sixth transistors M1 to M6 can be P-MOS transistors. However, the first to sixth transistors M1 to M6 are not limited thereto.

In the first transistor M1, the first electrode is connected to a first power line VL1, through which first power ELVDD is delivered, the gate electrode is connected to a first node N1, and the second electrode is connected to a second node N2. The first transistor M1 allows driving current to flow from the first electrode connected to the first power ELVDD to the second electrode connected to the second node N2 in response to a voltage delivered to the gate electrode.

In the second transistor M2, the first electrode is connected to a data line DL, the gate electrode is connected to a gate line GL, through which a gate signal is provided, and the second electrode is connected to a first electrode of the first capacitor C1. In response to a gate signal provided to the gate electrode, the second transistor M2 delivers a data voltage Vdata, corresponding to a data signal, from the first electrode connected to the data line DL to the first electrode of the first capacitor C1.

In the third transistor M3, the first electrode is connected to the second node N2, the gate electrode is connected to the gate line GL, and the second electrode is connected to the first node N1. In response to the gate signal provided to the gate electrode, the third transistor M3 controls the voltage of the first node N1 and the voltage of the second node N2 to be equal, so that the first transistor M1 can allow the current to flow to the second node N2. In this instance, a voltage corresponding to the threshold voltage can be stored in the first capacitor C1 connected to the first node N1.

In the fourth transistor M4, the first electrode is connected to an initialization power line VL2, through which an initialization voltage Vref is delivered, the gate electrode is connected to an emission control line EL, through which an emission control signal is provided, and the second electrode is connected to the first electrode of the first capacitor C1 and the second electrode of the second transistor M2. In response to the emission control signal provided to the gate electrode, the fourth transistor M4 delivers the initialization voltage Vref to the first electrode of the first capacitor C1 and the second electrode of the second transistor M2.

In the fifth transistor M5, the first electrode is connected to the second node N2, the gate electrode is connected to the emission control line EL, through which the emission control signal is provided, and the second electrode is connected to the anode of the OLED. In response to the emission control signal provided through the gate electrode, the fifth transistor M5 provides the driving current to the OLED.

In the sixth transistor M6, the first electrode is connected to the initialization power line VL2, through which the initialization voltage Vref is delivered, the gate electrode is connected to an initialization control line IL, through which an initialization control signal is provided, and the second electrode is connected to the anode of the OLED. In response to the initialization control signal provided to the gate electrode, the sixth transistor M6 can deliver the initialization voltage Vref to the anode of the OLED. Since the initialization voltage Vref is lower than the threshold voltage of the OLED, the OLED does not generate light in an initialization section, in which the initialization voltage Vref is delivered.

The first capacitor C1 is connected between the first node N1 and the second electrode of the second transistor M2. When the fourth transistor M4 is turned on, the first capacitor C1 receives the initialization voltage Vref. When the third transistor M3 is turned by the gate signal, the first capacitor C1 receives a voltage corresponding to the threshold voltage.

In addition, in the OLED, the anode is connected to the second electrodes of the fifth transistor M5 and the sixth transistor M6, and the cathode is connected to the second power ELVSS. When the fifth transistor M5 is turned on, the OLED generates light by receiving the driving current.

The voltage of the first power ELVDD can be set to the first voltage Vd1 (FIG. 4 or 5) in the normal mode and the first power ELVDD can be set to the second voltage Vd2 (FIG. 4 or 5) in the standby mode.

In the first transistor M1, the voltage of the first power ELVDD, the voltage applied to the gate electrode, and the voltage applied to the second electrode are determined. The voltage of the first power ELVDD can be determined to be the second voltage Vd2 when Formula 4 is satisfied.

$$ELVDD-ELVSS<(V_{data}-V_{ref}) \quad (4),$$

where ELVDD indicates the voltage of the first power, ELVSS indicates the voltage of the second power, Vdata indicates the data voltage corresponding to the data signal, and Vref indicates the voltage of the initialization signal.

Figure 8:
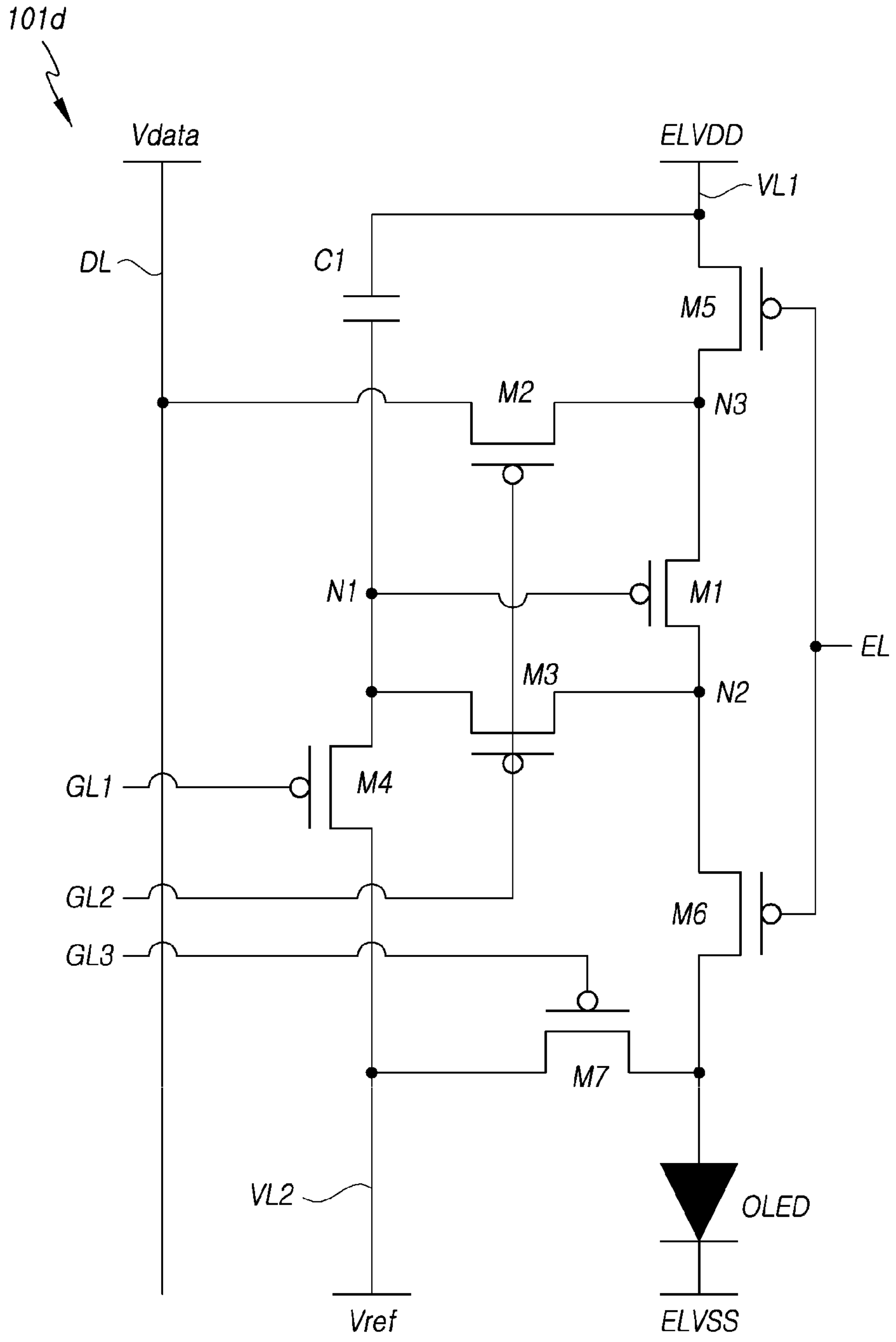
FIG. 8 is a circuit diagram illustrating a fourth embodiment of the pixel provided in the organic light-emitting display device illustrated in FIG. 1.

FIG. 8 is a circuit diagram illustrating a fourth embodiment of the pixel provided in the organic light-emitting display device illustrated in FIG. 1.

Referring to FIG. 8, a pixel 101 includes a pixel circuit 101*d* generating driving current and an OLED. The pixel circuit 101*d* receives a data voltage Vdata, a first gate signal, a second gate signal, a third gate signal, an emission control signal, a voltage of first power ELVDD, a voltage of second power ELVSS, and an initialization voltage Vref. In addition, the pixel circuit 101*d* includes first to seventh transistors M1 to M7 and a first capacitor C1. The first transistor M1 can be a driving transistor. The first to seventh transistors M1 to M7 respectively include a first electrode, a second electrode, and a gate electrode. The first electrode can be a drain electrode, while the second electrode can be a source electrode. However, the first and second electrodes are not limited thereto. In addition, the first to seventh transistors M1 to M7 can be P-MOS transistors. However, the first to seventh transistors M1 to M7 are not limited thereto.

In the first transistor M1, the first electrode is connected to a third node N3, the gate electrode is connected to the first node N1, and the second electrode is connected to the second node N2. The first transistor M1 allows driving current to flow from the first electrode to the second electrode in response to a voltage delivered to the gate electrode.

In the second transistor M2, the first electrode is connected to the data line DL, the gate electrode is connected to the second gate line, and the second electrode is connected to the third node N3. The second transistor M2 delivers a data voltage to the third node N3 in response to a second gate signal provided to the gate electrode through a second gate line GL2.

In the third transistor M3, the first electrode is connected to the second node N2, the gate electrode is connected to the second gate line GL, and the second electrode is connected to the second node N2. In response to the second gate signal provided to the gate electrode through the second gate line GL, the third transistor M3 controls the potential of the first node N1 and the potential of the second node N2 to be equal.

In the fourth transistor M4, the first electrode is connected to an initialization power line VL2, through which an initialization voltage Vref is delivered, the gate electrode is connected to the first gate line GL, through which a first gate signal is provided, and the second electrode is connected to the first node N1. The fourth transistor M4 delivers the initialization voltage Vref to the first node N1 in response to the first gate signal provided through the first gate line GL1.

In the fifth transistor M5, the first electrode is connected to a first power line VL1, the gate electrode is connected to an emission control line EN, and the second electrode is connected to the third node N3. In response to the emission control signal provided through the emission control line EL, the firth transistor M5 supplies the voltage of the first power ELVDD delivered to the first power line VL1 to the third node N3.

In the sixth transistor M6, the first electrode is connected to the second node N2, the gate electrode is connected to the emission control line EL, through which the emission control signal is provided, and the second electrode is connected to the anode of the OLED. In response to the emission control signal provided to the gate electrode, the sixth transistor M6 provides the driving current flowing through the second node N2 to the OLED.

In the seventh transistor M7, the first electrode is connected to the initialization power line VL2, through which the initialization voltage Vref is delivered, the gate electrode is connected to the third gate line, through which a third gate signal is provided, and the second electrode is connected to the anode of the OLED. In response to the third gate signal provided to the gate electrode, the seventh transistor M7 can deliver the initialization voltage Vref to the anode of the OLED. The voltage level of the initialization voltage Vref can be lower than the voltage level of the threshold voltage of the OLED.

The first capacitor C1 is connected to the first power line VL1, through which the first power ELVDD is supplied, as well as the first node N1, to store a voltage corresponding to a data voltage Vdata. In addition, the first capacitor C1 can be initialized by the initialization voltage Vref. When the second transistor M2 and the third transistor M3 are turned on by the second gate signal, the data voltage Vdata is delivered to the first node N1 through the first transistor M1 and the third transistor M3, so that a voltage corresponding to the threshold voltage is stored in the first node N1. Thus, the threshold voltage can be compensated for.

In the OLED, the anode is connected to the second electrode of the sixth transistor M6 and the second electrode of the seventh transistor M7, and the cathode is connected to the second power ELVSS.

The voltage of the first power ELVDD can be set to the first voltage Vd1 (FIG. 4 or 5) in the normal mode and the first power ELVDD can be set to the second voltage Vd2 (FIG. 4 or 5) in the standby mode.

In the first transistor M1, the voltage of the first power ELVDD, the voltage applied to the gate electrode, and the voltage applied to the second electrode are determined. The voltage of the first power ELVDD can be determined to be the second voltage Vd2 when Formula 5 is satisfied.

$$ELVDD-ELVSS<V_{ref}-V_{data} \quad (5),$$

where ELVDD indicates the voltage of the first power, ELVSS indicates the voltage of the second power, Vdata indicates the data voltage corresponding to the data signal, and Vref indicates the voltage of the initialization signal.

Figure 9A:
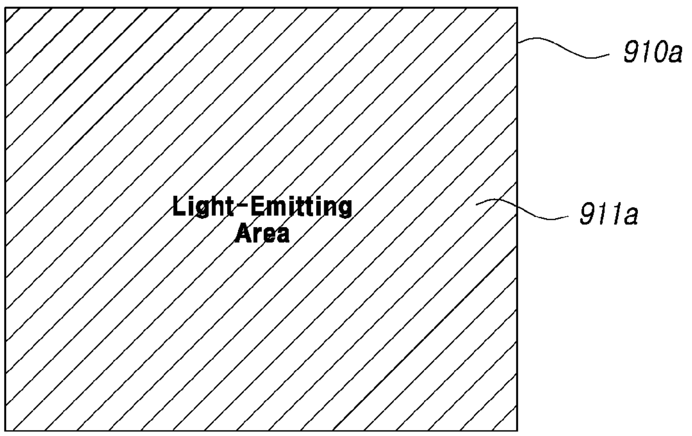
FIG. 9A is a plan view illustrating an embodiment of the display panel illustrated in FIG. 1 on which an image is displayed.

FIG. 9A is a plan view illustrating a first embodiment of the display panel illustrated in FIG. 1 on which an image is displayed.

Referring to FIG. 9A, all pixels of the display panel 110 can generate light in both a normal mode and a standby mode. Thus, the same area of the display panel can emit light in both the normal mode and the standby mode. In the normal mode, as illustrated in FIG. 4, the luminance of all pixels can vary along the first curve A in response to data signals. In the standby mode, the luminance of all pixels can vary along the second curve B. Since the amount of driving current flowing through the display panel in the standby mode is smaller than in the normal mode, it is possible to reduce power consumption without changing the data voltage in the standby mode by significantly reducing the amount of driving current flowing through the display panel.

Figure 9B:
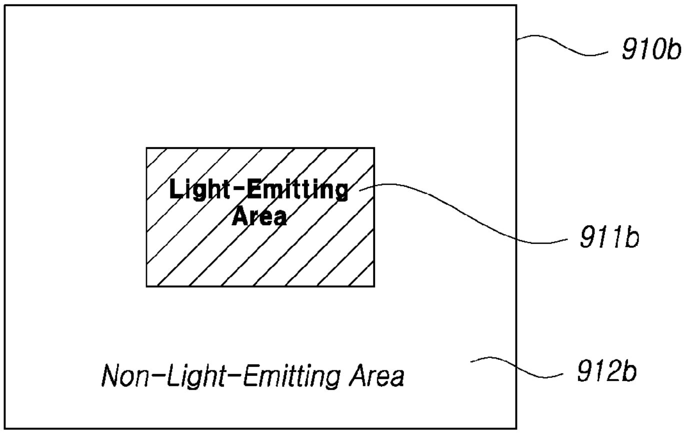
FIG. 9B is a plan view illustrating an embodiment of the display panel illustrated in FIG. 1 on which an image is displayed.

FIG. 9B is a plan view illustrating a second embodiment of the display panel illustrated in FIG. 1 on which an image is displayed.

Referring to FIG. 9B, specific pixels among a number of pixels of the display panel, located in a specific area, can emit light, while the remaining pixels located in the remaining area do not emit light. The number of the pixels emitting light in the standby mode is less than the number of the pixels emitting light in the normal mode. That is, the area of the display panel that emits light in the standby mode can be smaller than the area of the display panel that emits light in the normal mode. Also, the luminance of the light-emitting pixels can be higher in the normal mode than in the standby mode. In this instance, power consumption can be reduced by a greater amount than in the standby mode illustrated in FIG. 9A.

Figure 10:
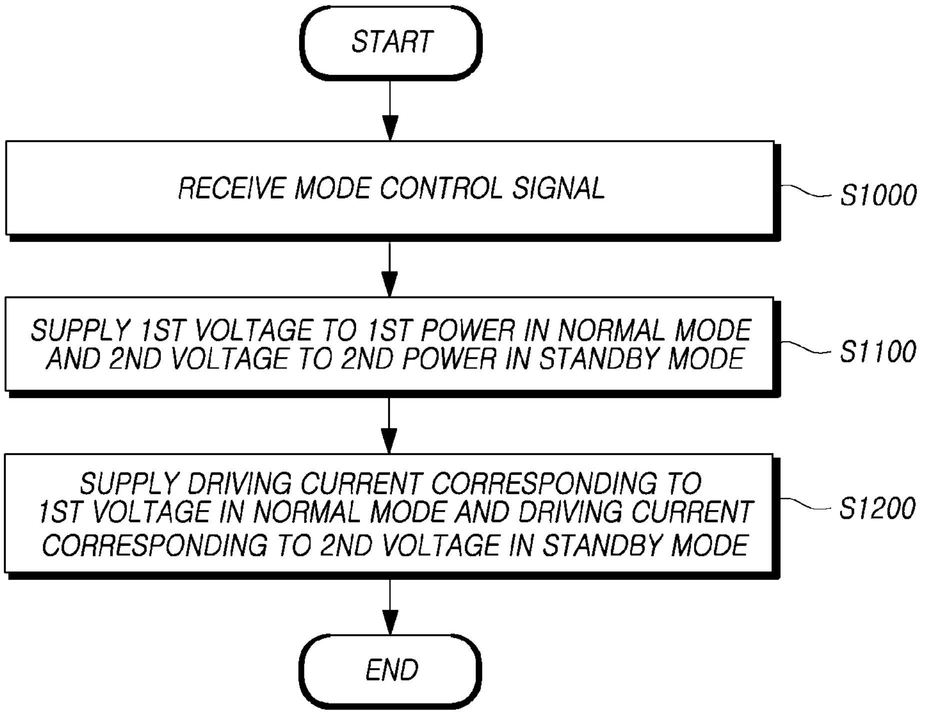
FIG. 10 is a flowchart illustrating a driving method for the organic light-emitting display device illustrated in FIG. 1, according to exemplary embodiments.

FIG. 10 is a flowchart illustrating a driving method for the organic light-emitting display device illustrated in FIG. 1, according to exemplary embodiments.

Referring to FIG. 10, the driving method for the organic light-emitting display device includes: a step S1000 of receiving a mode control signal for instructing a normal mode or a standby mode; a step S1100 of providing a first voltage to first power in the normal mode and providing a second voltage to the first power in the standby mode, in which the second voltage is lower than the first voltage; and a step S1200 of providing driving current corresponding to the first voltage to an OLED in the normal mode and providing driving current corresponding to the second voltage to the OLED in the standby mode.

The control circuit 130 can output the mode control signal, and the organic light-emitting display device can operate in the normal mode as well as in the standby mode in response to the mode control signal. The control circuit 130 can output the mode control signal to instruct the organic light-emitting display device to operate in the normal mode as well as in the standby mode, by determining whether or not the organic light-emitting display device is being used.

In addition, the mode control signal allows the organic light-emitting display device to receive a first voltage or a second voltage supplied from the first power. The organic light-emitting display device can operate in the normal mode when the first voltage is received and in the standby mode when the second voltage is received.

In addition, the organic light-emitting display device includes the number of pixels, each of which can emit light at a lower level of luminance upon receiving a second voltage, since the driving current corresponding to the second voltage is smaller than that of a first voltage. Accordingly, it is possible to vary luminance without varying a data voltage. Also, lowering luminance reduces power consumption. Each of the number of pixels includes a driving transistor to adjust the magnitude of driving current in response to the first voltage or the second voltage.

According to exemplary embodiments, the voltage level of the second voltage can be determined such that the difference between the amount of driving current corresponding to the first voltage and the data voltage, and the amount of driving current corresponding to the second voltage and the data voltage is greater than a predetermined value.

In addition, according to exemplary embodiments, a change in the amount of driving current flowing through a pixel when the second voltage is changed by a predetermined voltage can be greater than a change in the amount of driving current flowing through the pixel when the first voltage is changed by the predetermined voltage.

The foregoing descriptions and the accompanying drawings have been presented in order to explain the certain principles of the present disclosure. A person skilled in the art to which the present disclosure relates could make many modifications and variations by combining, dividing, substituting for, or changing the elements without departing from the principle of the present disclosure. The foregoing embodiments disclosed herein shall be interpreted as illustrative only but not as limitative of the principle and scope of the present disclosure. It should be understood that the scope of the present disclosure shall be defined by the appended Claims and all of their equivalents fall within the scope of the present disclosure.

What is claimed is:

1. An organic light-emitting display device comprising:

a display panel including a plurality of pixels and configured to express luminance based on a driving current corresponding to a data signal for providing a data voltage and a first power;

a control circuit configured to output a first mode control signal corresponding to a normal mode and a second mode control signal corresponding to a standby mode for providing lower luminance than the normal mode; and a power source configured to:

supply the first power to the display panel at a first voltage level, in response to receiving the first mode control signal corresponding to the normal mode, and supply the first power to the display panel at a second voltage level that is lower than the first voltage level, in response to receiving the second mode control signal corresponding to the standby mode, wherein a change of an amount of the driving current corresponding to a change of the data voltage level in the normal mode is greater than a change of an amount of the driving current corresponding to the data voltage level in the standby mode.

2. The organic light-emitting display device according to claim 1, wherein a greater number of the plurality of pixels emit light in the normal mode than in the standby mode, and wherein an inner area of the display panel emits light while an outer area of the display panel does not emit light in the standby mode.

3. The organic light-emitting display device according to claim 1, wherein when the at least one pixel is supplied with the first power at the second voltage level and the data voltage, the at least one pixel expresses a lower luminance than when the at least one pixel is supplied with the first power at the second voltage level and the same data voltage.

4. The organic light-emitting display device according to claim 1, wherein at least one pixel among the plurality of pixels includes an organic light-emitting diode and a first transistor configured to supply the driving current to the organic light-emitting diode, wherein the first transistor comprises a first electrode connected to the first power, a gate electrode configured to receive a voltage corresponding to the data voltage, and a second electrode connected to the organic light-emitting diode, and wherein the driving current flows from the first electrode to the second electrode and to the organic light-emitting diode based on the voltage of the gate electrode and a voltage of the second electrode.

5. The organic light-emitting display device according to claim 4, wherein a voltage difference between the first electrode and the second electrode of the first transistor is set smaller than a voltage difference between the second electrode and the gate electrode of the first transistor subtracted from a threshold voltage of the first transistor.

6. A method of driving an organic light-emitting display device including a display panel having a plurality of pixels configured to express luminance based on a driving current corresponding to a data signal for providing a data voltage, the method comprising:

receiving a first mode control signal for a normal mode;

receiving a second mode control signal for a standby mode that provides lower luminance than the normal mode;

supplying a first power at a first voltage level to the display panel, in response to receiving the first mode control signal corresponding to the normal mode; and supplying the first power at a second voltage level that is lower than the first voltage level to the display panel, in response to receiving the second mode control signal corresponding to the standby mode, wherein a change of an amount of the driving current corresponding to a change of the data voltage level in the normal mode is greater than a change of an amount of the driving current corresponding to the data voltage level in the standby mode.

7. The method according to claim 6, further comprising:

emitting light with a first number of pixels among the plurality of pixels in the normal mode;

emitting light with a second number of pixels among the plurality of pixels in the standby mode; and emitting light from an inner area of the display panel while an outer area of the display panel does not emit light in the standby mode, wherein the first number of pixels is greater than the second number of pixels.

8. The method according to claim 6, further comprising:

supplying the driving current to at least one pixel in the plurality of pixels, wherein a voltage difference between first and second electrodes of a first transistor in the at least one pixel is set smaller than a voltage difference between the second electrode and the gate electrode of the first transistor subtracted from a threshold voltage of the first transistor.

* * * * *